(12) United States Patent
Ackermann et al.

(10) Patent No.: US 12,457,672 B2
(45) Date of Patent: Oct. 28, 2025

(54) ELECTRONIC CIRCUIT WITH ISOLATION

(71) Applicant: SIGNIFY HOLDING B.V., Eindhoven (NL)

(72) Inventors: Bernd Ackermann, Aachen (DE); Eugen Jacob De Mol, Eindhoven (NL); Ludoviscus Franciscus Johannes Oostvogels, Nuenen (NL)

(73) Assignee: SIGNIFY HOLDING B.V., Eindhoven (NL)

( * ) Notice: Subject to any disclaimer, the term of this patent is extended or adjusted under 35 U.S.C. 154(b) by 338 days.

(21) Appl. No.: 17/927,030

(22) PCT Filed: May 28, 2021

(86) PCT No.: PCT/EP2021/064310
§ 371 (c)(1),
(2) Date: Nov. 22, 2022

(87) PCT Pub. No.: WO2021/244960
PCT Pub. Date: Dec. 9, 2021

(65) Prior Publication Data
US 2023/0209681 A1    Jun. 29, 2023

(30) Foreign Application Priority Data
Jun. 5, 2020   (EP) .................................... 20178423

(51) Int. Cl.
*H05B 45/382* (2020.01)
*H01F 27/06* (2006.01)
*H05B 45/12* (2020.01)

(52) U.S. Cl.
CPC ........... *H05B 45/382* (2020.01); *H01F 27/06* (2013.01); *H05B 45/12* (2020.01); *H01F 2027/065* (2013.01)

(58) Field of Classification Search
CPC . H01F 27/06; H01F 2027/065; H05K 1/0256; H05K 1/145
See application file for complete search history.

(56) References Cited

U.S. PATENT DOCUMENTS

2007/0279906 A1   12/2007  He et al.
2014/0197914 A1    7/2014  Go Chua et al.
2019/0335584 A1   10/2019  Burani et al.

FOREIGN PATENT DOCUMENTS

DE   202018101423 U1 *  7/2019  ........... H01F 27/027
JP         S6430292 A     2/1989

* cited by examiner

*Primary Examiner* — Nathan Milakovich

(57) ABSTRACT

A circuit comprises a first printed circuit board (60) carrying a first set of components and a second printed circuit board (62) carrying a second set of components, with a clearance (64) between the first and second printed circuit boards. A transformer (66) has a primary side connected to the first set of components and a secondary side connected to the second set of components. One of the transformer windings, and its connection to a respective set of components, comprises a triple insulated wire. A glass, ceramic or mica spacer (70) mounted to the first and second printed circuit boards defines and sets the clearance (64) between the first and second printed circuit boards. The clearance requirement is met by providing separate printed circuit boards with spacing between them and the use of a triple insulated wire addresses or overcomes issues of creepage. Thus, high frequency and high voltage operation on the first printed circuit board is possible.

13 Claims, 7 Drawing Sheets

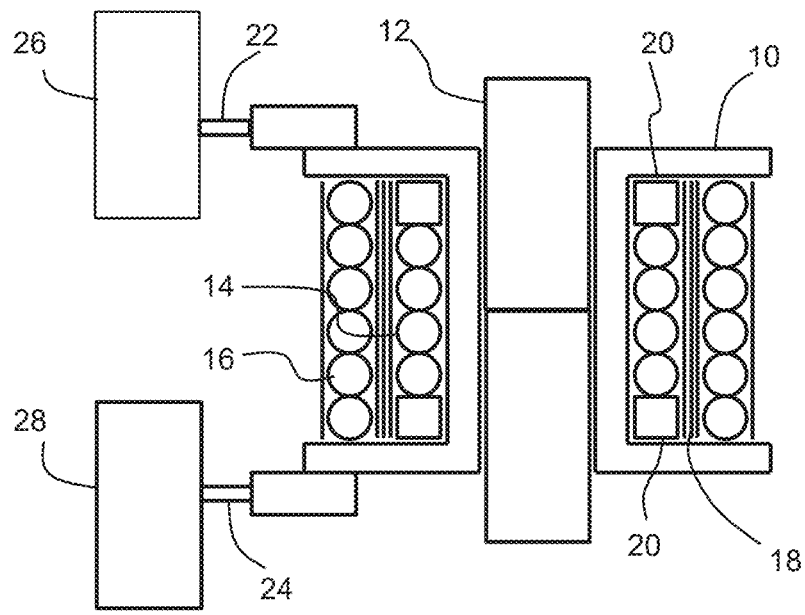
FIG. 1- PRIOR ART
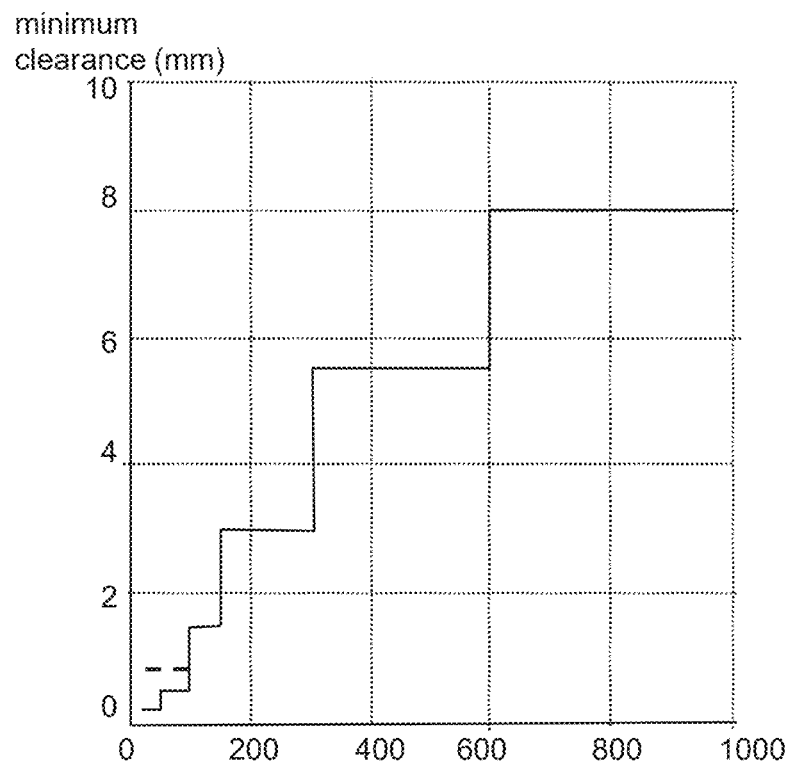
FIG. 2 - PRIOR ART

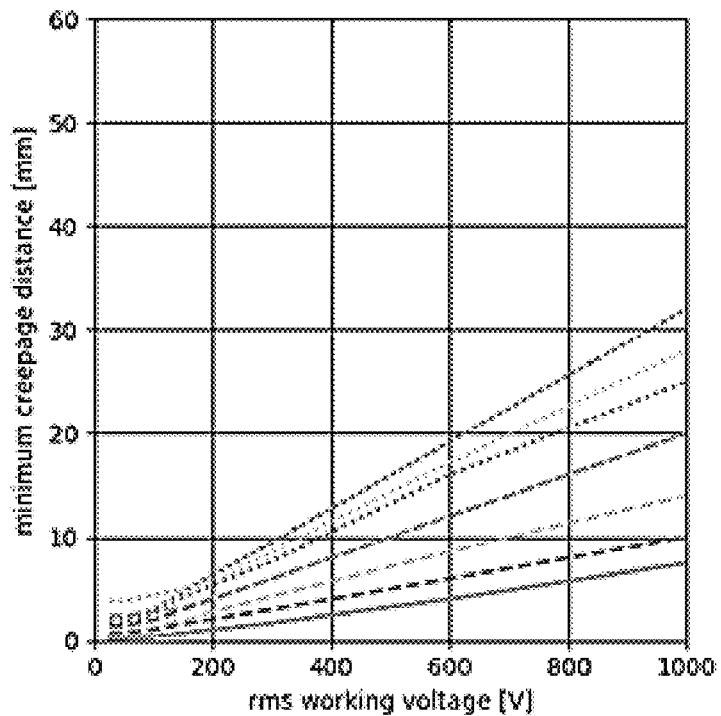
FIG. 3 - PRIOR ART
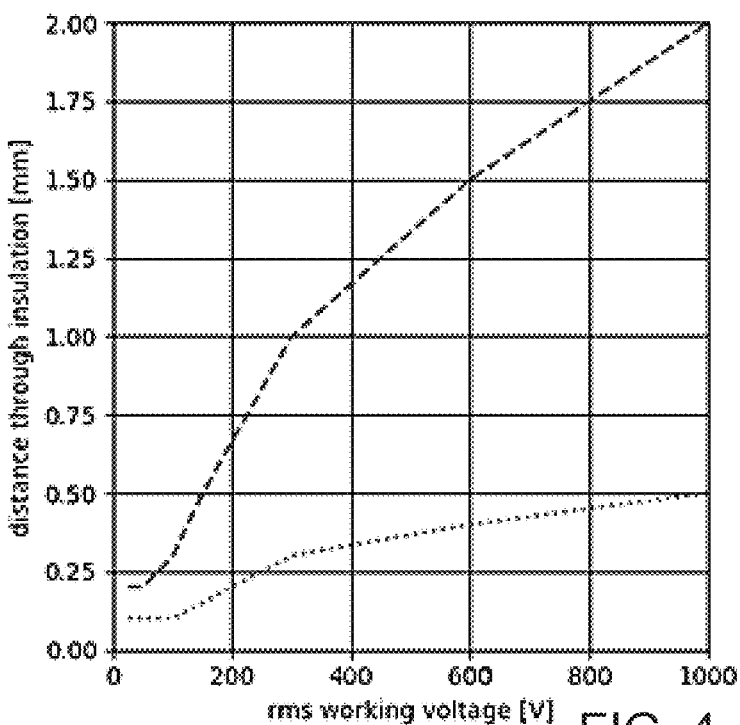
FIG. 4 - PRIOR ART

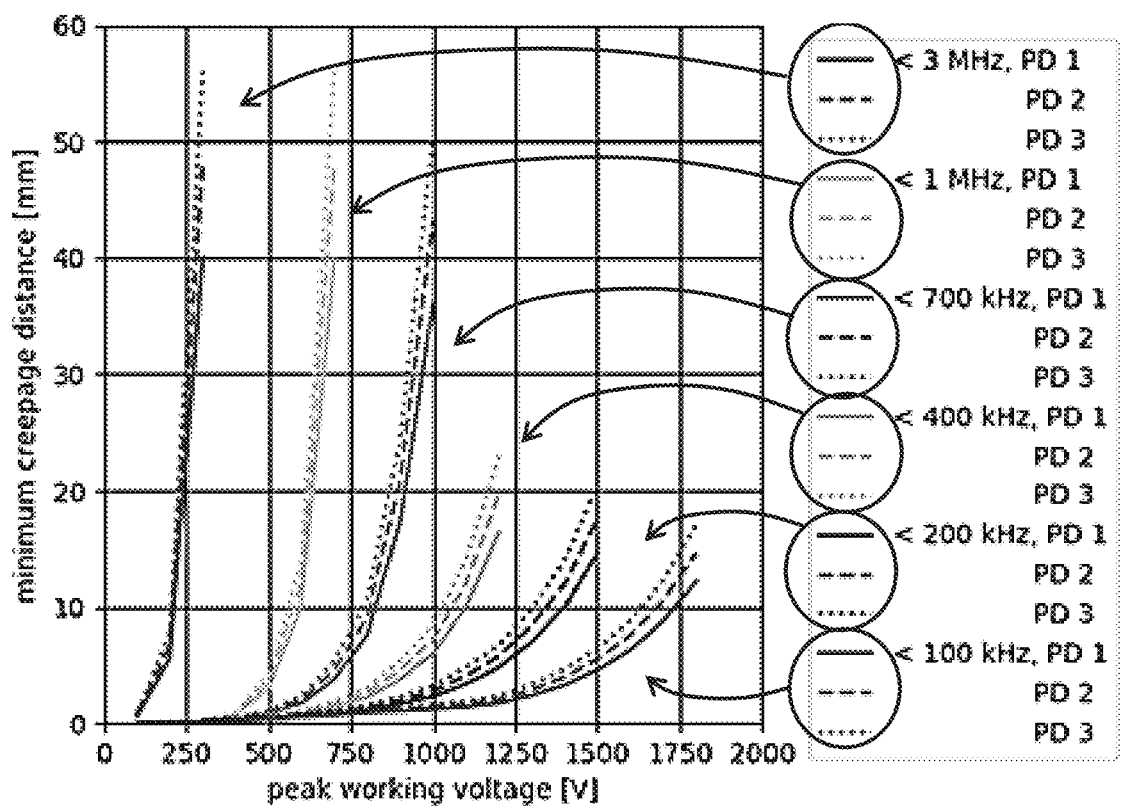
FIG. 5 - PRIOR ART

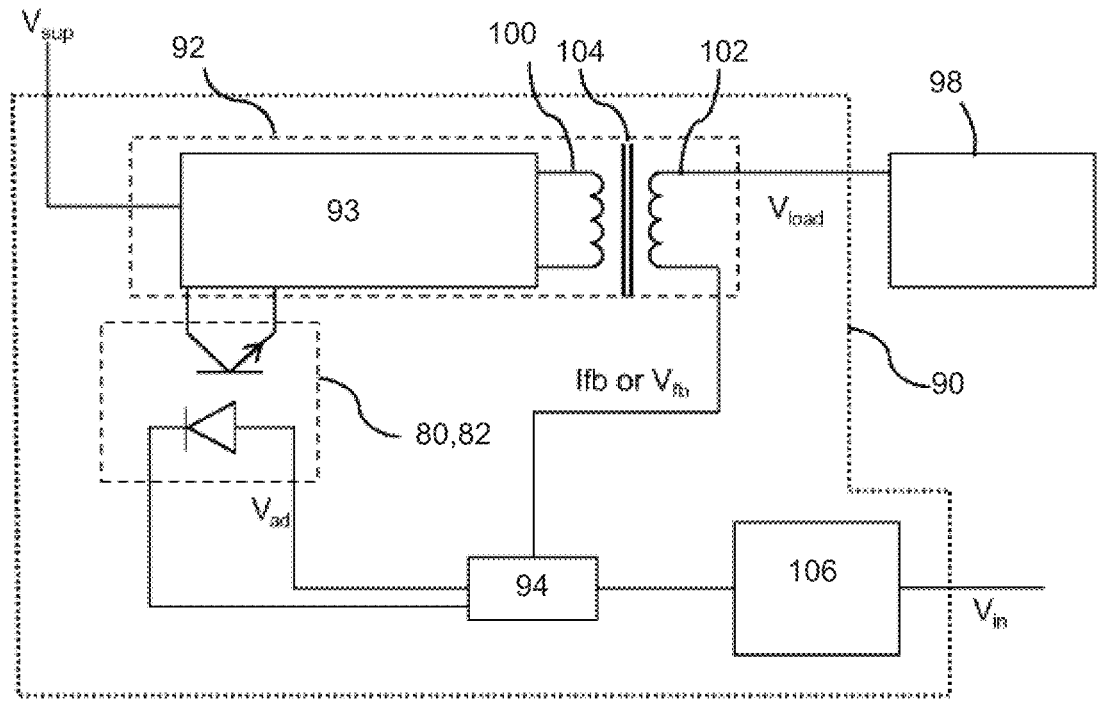
FIG. 11 - PRIOR ART
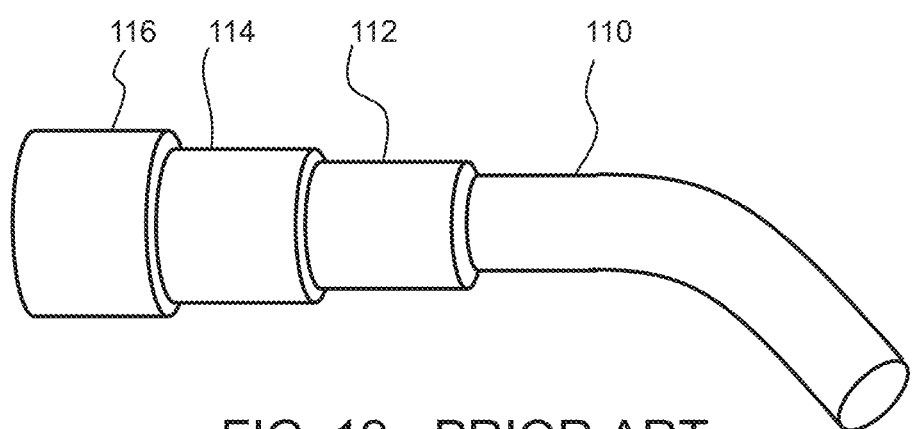
FIG. 12 - PRIOR ART

ELECTRONIC CIRCUIT WITH ISOLATION

CROSS-REFERENCE TO PRIOR APPLICATIONS

This application is the U.S. National Phase application under 35 U.S.C. § 371 of International Application No. PCT/EP2021/064310, filed on May 28, 2021, which claims the benefit of European Patent application Ser. No. 20/178, 423.8, filed on Jun. 5, 2020. These applications are hereby incorporated by reference herein.

FIELD OF THE INVENTION

This invention relates to an electronic circuit with isolation, for example between a high voltage section at the input side of the circuit and a low voltage section at the output side of the circuit.

BACKGROUND OF THE INVENTION

An example of an electronic circuit having a high voltage section and a low voltage section is an isolated switch mode power supply (SMPS). The high voltage section for example is supplied by the mains and includes high frequency switching components, and the low voltage section is at the output of the power supply, for supplying a load. The load may for example be a lighting arrangement, supplied with a (relatively) low DC voltage. The output voltage or current is regulated by the switch mode power supply.

The isolation between the high voltage section and the low voltage section takes place across an isolating transformer.

Electrical safety considerations result in safety distance requirements, for both clearance and creepage distances, between the hazardous high voltages at the input side of the switch mode power supply and the safe low voltages at the output side.

The creepage distance is the shortest path between two conductive parts measured along the surface of the insulation between them. A proper and adequate creepage distance protects against tracking, which is a process that produces a partially conducting path of localized deterioration on the surface of an insulating material as a result of the electric discharges on (or close to) an insulation surface. The degree of tracking depends on three major factors; the voltage difference between the two conductive parts, the properties (in particular the comparative tracking index) of the material and the degree of pollution in the environment. Tracking may damage the insulating material as a result of humidity in the atmosphere, contamination, corrosive chemicals or the altitude at which equipment is to be operated.

The clearance distance is the shortest distance between two conductive parts measured through air. A sufficient clearance distance prevents dielectric breakdown between electrodes caused by the ionization of air. The dielectric breakdown is also influenced by a voltage difference between the two conductive parts, relative humidity, temperature, and degree of pollution in the environment.

By way of example, these issues may typically require a switch mode power supply to allow an 8 mm creepage distance between primary and secondary circuits.

The separation between the hazardous high voltages and safe low voltages is usually realized by providing a physical layout which guarantees the suitable clearance and creepage distances, and using solid insulation, typically in the form of insulation tapes, between the primary winding and secondary winding in the isolating transformer.

FIG. 1 shows a known layout of an isolating transformer. It comprises a bobbin 10 around the transformer core 12. The primary winding 14 and secondary winding 16 are wrapped around the bobbin. Several tape insulator layers 18 are provided between the windings. However, to ensure the creepage distance requirements are met, spacers 20 are also needed, so that a distance along the surface of the tape insulator layers 18 between the primary and secondary windings meets the required minimum creepage distance. The primary winding 14 leads to a first pair of contact pins 22 (only one is seen as one is behind the other) for connecting the transformer to a PCB area 26 and the secondary winding leads to a second pair of pins 24 (only one is seen as one is behind the other) for connecting the transformer to a PCB area 28.

The PCBs areas 26 and 28 may be part of the same PCB, optionally with a slot between them, or they may be parts of different PCBs.

The electrical, thermal and mechanical safety requirements for isolating transformers used in LED drivers are for example stipulated by IEC 61347-1 in conjunction with IEC 61347-2-13. IEC 61347-2-13 states that isolating transformers used in LED drivers shall comply with the relevant parts of IEC 61558. IEC 61558-1 in particular states the minimum creepage distances, clearance distances, and distances through insulation up to and including 30 kHz.

FIG. 2 shows the clearance requirements for double insulation with two different levels of assumed pollution (known as pollution degree 2 and pollution degree 3) according to IEC 61558-1, and as a function of working voltage. The two plots only diverge below 100V. For pollution degree 1, there is no minimum clearance.

The working voltage is defined as the highest (peak) voltage to which the insulation under consideration can be subjected when the equipment is operating at its rated voltage under normal use conditions.

FIG. 3 shows the creepage distance requirements for double insulation for four different material groups (and for the three pollution degrees 1 to 3) as a function of working voltage for one operating frequency. It shows that the creepage distance depends on the pollution level and the material type.

FIG. 4 shows the requirement for the distance through insulation for a solid material layer and for a stack of thin layers as a function of working voltage. It shows that the layer structure influences the thickness requirements.

FIGS. 2 to 4 show that the various distance requirements each scale with the working voltage. The smallest requirements always apply for pollution degree 1 where differences between material groups are negligible. The safety distances (clearance distances and creepage distances) must also be obeyed on the printed circuit board (PCB) on which the isolating transformer is mounted. Thus, the stipulated minimum creepage distance must be less than the length along the shortest path along a surface between the conductive parts of the two circuits to be isolated. This path for example may travel around a PCB slot.

IEC 61558-2-16 in particular states the minimum creepage distances, clearance distances, and distances through insulation above 30 kHz and up to and including 3 MHz.

FIG. 5 shows that the minimum creepage distance varies as a function of working voltage but also for different frequencies of operation. At each operating frequency, the three pollution degrees 1 to 3 (for the same material) are shown.

It can be seen that at the typical operation frequency of a switch mode power supply, such as 500 kHz and at 700V, the creepage distance is only a few mm, and it is possible to factor this in the design of the transformer, such as shown in FIG. 1.

However, there is a desire to use GaN power transistors to form high speed and high power circuits, in switch mode power supplies as well as in other circuits. GaN power transistors are more efficient than Si power transistors and can be operated at significantly higher switching frequencies. This may for example result in LED drivers or other switch mode power supplies which are smaller, lower weight, more compact, more efficient and potentially cheaper.

Fully exploiting the benefits of GaN power transistors requires operating frequencies of several hundred kHz to a few MHz and operating voltages of several hundred volts. At such high operating frequencies and operating voltages, the creepage distances required e.g. by IEC 61558-2-16 to achieve adequate electrical insulation for product safety are significantly higher than creepage distances prescribed by legacy standards that do not take high frequency operation into account. For example, FIG. 5 shows the minimum creepage distance for 750V and 1 MHz is around 60 mm. It is impractical to implement this creepage distance within a compact transformer module, which may be required to have an axial length of only around 20 mm.

Thus, the conventional isolation transformer design depicted in FIG. 1 will no longer be feasible. Sophisticated mechanical constructions of high voltage transformers have been proposed to increase creepage distances, but even these will be impractical and result in bulky transformers for the large creepage distances required at the high frequencies and high voltages at which the SMPS and isolation transformer would ideally be operated, in order to reduce their size and weight.

There is therefore a need for a circuit design which allows isolation to be provided from a high voltage high frequency circuit, while meeting the minimum safety requirements for creepage and clearance distances.

SUMMARY OF THE INVENTION

The invention is defined by the claims.

According to examples in accordance with an aspect of the invention, there is provided a circuit, comprising:
  a first printed circuit board carrying a first set of components;
  a second printed circuit board carrying a second set of components, with a clearance between the first and second printed circuit boards; and
  a transformer having a primary side winding and a secondary side winding, wherein the primary side winding is electrically connected to the first set of components by a first connection arrangement and the secondary side winding is connected to the second set of components by a second connection arrangement,
  wherein the primary side winding and the first connection arrangement and/or the secondary side winding and the second connection arrangement comprise an insulated wire.

The clearance requirement is met by providing separate printed circuit boards with a spacing between them. The clearance distance does not scale with frequency in the same way as the creepage distance, so a compact design is possible with sufficient space between the printed circuit boards to implement the required clearance, even at high frequencies.

The use of a wire, as both a transformer winding and the connection to a printed circuit board, reduces or overcomes the issue of creepage, either by providing a sufficient length or else using a wire which is considered safe and can achieve regulatory compliance on creepage without requiring the standard minimum creepage distance to be met. This is the case for triple insulated wire.

In particular, the use of triple insulated wire addresses the issue of partial discharges. There are materials that suffer from partial discharges and materials that do not suffer from partial discharges. Glass, ceramic and mica are examples of materials which do not suffer from partial discharges. However, testing of structures based on materials which inherently do suffer from partial discharges enables such structures to be used at high frequencies and high voltages when safety has been proven. Triple insulated wire is an example where such safety has been proved, in that testing and optimization of the material, structure and manufacturing process has been conducted (as it is much more feasible for a simple part like a wire than for a complete transformer).

In a first example, the transformer is mounted on the first printed circuit board, and the secondary side winding and the second connection arrangement comprise a triple insulated wire, and the second connection arrangement extends across the clearance between the first and second printed circuit boards.

In a second example, the transformer is mounted on the second printed circuit board, and the primary side winding and the first connection arrangement comprise a triple insulated wire, and the first connection arrangement extends across the clearance between the first and second printed circuit boards.

Thus, the transformer may be a surface mount component which may be applied to either the first or the second printed circuit board. Note that the triple insulated wire may be used, if desired, for both windings and both connection arrangements.

A glass, ceramic or mica spacer may be mounted to the first and second printed circuit boards, which defines the clearance between the first and second printed circuit boards.

Alternatively, a first spacer may be mounted to the first printed circuit board and to an intermediate support part and a second spacer may be mounted to the second printed circuit board and to the intermediate support part, wherein the first spacer and/or the second spacer comprises glass, ceramic or mica, and the clearance between the first and second printed circuit boards being defined by the first spacer, second spacer and the support part.

The spacer or spacers are chosen to be particularly resistant to partial discharges. Such inorganic insulation materials are not damaged by corona discharges and as a result there is no creepage distance requirement between the first and second printed circuit boards, but clearance requirements apply.

In another example, a glass, ceramic or mica spacer is again mounted to the first and second printed circuit board, which defines the clearance between the first and second printed circuit boards, and the transformer is mounted at (e.g. on) the spacer. The transformer may thus be mounted separate to the first and second printed circuit boards.

Alternatively, the transformer may comprise a bobbin formed by the spacer, and the primary and secondary windings are wound around the bobbin. Thus, the spacer is used to provide the desired clearance but also doubles as part of the transformer structure.

The first set of components for example include GaN or SiC or other wide band gap semiconductor transistors. GaN and SiC are examples of wide band gap semiconductor materials. These may be used as high voltage high frequency transistors. For example, they may have a working voltage of over 400V, for example over 500V, for example over 700V, and a frequency of operation of over 750 kHz, for example over 1 MHz, for example over 1.5 MHz.

The second set of components for example include Si transistors. They may have a working voltage of below 400V.

The first and second sets of components for example together define a switch mode power supply. The isolating transformer provides isolation between the input and output side of the switch mode power supply.

The invention also provides an LED driver comprising:
an input for receiving a mains input voltage;
a switch mode power supply comprising the circuit as defined above; and
an output for delivering a DC voltage with regulated current and/or voltage to an LED arrangement.

The LED driver may further comprise an optical feedback system for providing optical feedback from the second set of components to the first set of components, comprising an optical transmitter mounted on the second printed circuit board and an optical receiver mounted on the first printed circuit board. This is used by the LED driver for regulating the output voltage and/or current using feedback from the secondary side.

The invention also provides a lighting circuit comprising:
the LED driver defined above; and
the LED arrangement, powered by the LED driver.

These and other aspects of the invention will be apparent from and elucidated with reference to the embodiment(s) described hereinafter.

BRIEF DESCRIPTION OF THE DRAWINGS

For a better understanding of the invention, and to show more clearly how it may be carried into effect, reference will now be made, by way of example only, to the accompanying drawings, in which:

FIG. 1 shows a known layout of an isolating transformer;

FIG. 2 shows the clearance requirements for double insulation with two different levels of assumed pollution and as a function of working voltage;

FIG. 3 shows the creepage distance requirements for double insulation for four different material groups (and for the three pollution degrees 1 to 3) as a function of working voltage;

FIG. 4 shows the requirement for the distance through insulation for a solid material layer and for a stack of thin layers as a function of working voltage;

FIG. 5 shows that the minimum creepage distance varies as a function of working voltage but also for different frequencies of operation above 30 kHz;

FIG. 11 shows an exemplary simplified prior art topology of a known driver; and FIG. 12 shows a triple insulated wire.

DETAILED DESCRIPTION OF THE EMBODIMENTS

Figure 6:
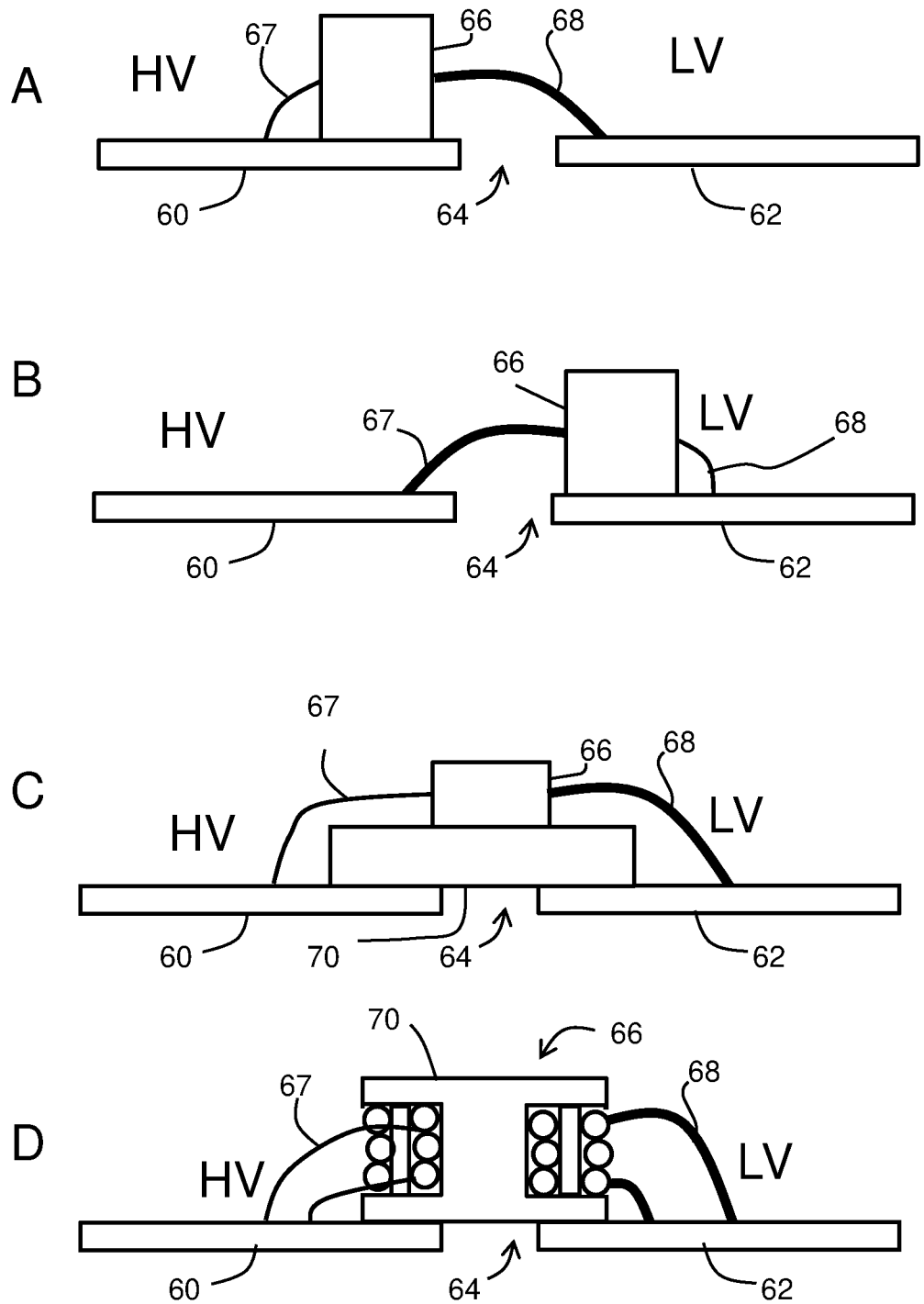
FIGS. 6A to 6D show various possible implementations of the invention in schematic form.

The invention will be described with reference to the Figures.

It should be understood that the detailed description and specific examples, while indicating exemplary embodiments of the apparatus, systems and methods, are intended for purposes of illustration only and are not intended to limit the scope of the invention. These and other features, aspects, and advantages of the apparatus, systems and methods of the present invention will become better understood from the following description, appended claims, and accompanying drawings. It should be understood that the Figures are merely schematic and are not drawn to scale. It should also be understood that the same reference numerals are used throughout the Figures to indicate the same or similar parts.

The invention provides a circuit which comprises a first printed circuit board carrying a first set of components and a second printed circuit board carrying a second set of components, with a clearance between the first and second printed circuit boards. A transformer has a primary side connected to the first set of components and a secondary side connected to the second set of components. One of the transformer windings, and its connection to a respective set of components, comprises an insulated wire. The clearance requirement is met by providing separate printed circuit boards with spacing between them and the use of the insulated wire addresses or overcomes issues of creepage. Thus, high frequency and high voltage operation on the first printed circuit board is possible.

The invention may involve use of a length of the insulated wire (e.g. single or double insulated wire) to meet the creepage requirements that apply, if they can be met within the available space. In preferred examples, the invention is based on an approach by which safety insulation is designed in such a way that creepage requirements no longer apply, in particular based on use of an insulated wire design which avoids the need for creepage requirements. Triple insulated wire is one example. This then avoids the need to provide large creepage distances when high frequencies and high voltages are to be applied.

Hazardous high voltage circuitry and safe low voltage circuitry are mounted on separate first (primary) and second (secondary) printed circuit boards. Clearance requirements apply between the first and second printed circuit boards. However, in the preferred examples, there is no creepage distance requirement between the first and second printed circuit boards since physical connection between them is only made using components that are not subject to creepage distance requirements.

FIG. 6 shows various possible implementation of the invention in schematic form. The invention will be described based on the use of triple insulated wire as a transformer winding and tail which spans or partially spans the clearance between PCBs.

In each case, there is a first printed circuit board 60 carrying a first set of components (not shown) and a second printed circuit board 62 carrying a second set of components (not shown), with a clearance 64 between the first and second printed circuit boards.

The first printed circuit board 60 carries components operated at a high frequency and at a high voltage (relative to the second printed circuit board), and equivalently, the second printed circuit board 62 carries components operated at a low voltage (relative to the first printed circuit board).

A transformer 66 has a primary side winding and a secondary side winding. The primary side winding is electrically connected to the first set of components by a first connection arrangement 67 and the secondary side winding is connected to the second set of components by a second connection arrangement 68.

The connection arrangement may preferably simply be the pair of tails of the respective winding, so that a single wire length defines the winding itself and the two connecting lines between the opposite ends of the winding and the printed circuit board. The ends of these tails then define the contact terminals for connection to the printed circuit board. The tails themselves (of one or both windings) extend across the clearance and these tails and the associated winding are in this example formed of triple insulated wire.

Alternatively, the transformer may be a module to which separate external wire connections are made, which external wire connections extend between the printed circuit board and the module. Thus, the external wire connections which need to span across the clearance are then formed as triple insulated wires.

In an example, the ends of the tails are soldered to pins. These pins are then for example inserted into through holes on the PCB and then soldered to these through holes.

In some examples, the primary side winding and the first connection arrangement comprise a triple insulated wire and the first connection arrangement crosses the clearance 64. In other examples, the secondary side winding and the second connection arrangement comprises a triple insulated wire and the second connection arrangement crosses the clearance 64. Alternatively, triple insulated wire may be used for both the windings and connection arrangements.

The transformer provides electrical insulation between hazardous high voltage circuitry and safe low voltage circuitry.

FIG. 6A shows a first example in which the transformer 66 is mounted on the first printed circuit board 60, and the secondary side winding and the second connection arrangement 68 comprise a triple insulated wire. The second connection arrangement 68 extends across the clearance 64 between the first and second printed circuit boards.

The tails of the primary side winding for example terminate with pins which connect through the first PCB 60. The tails of the secondary side winding form the second connection arrangement 68. The ends of the tails of the secondary side winding are for example attached to the second printed circuit board by soldering them to solder pads or by using connectors. These connectors may for example comprise a plug and a socket.

FIG. 6B shows a second example, in which the transformer 66 is mounted on the second printed circuit board 62, and the primary side winding and the first connection arrangement 67 comprise a triple insulated wire, and the first connection arrangement 67 extends across the clearance between the first and second printed circuit boards.

The tails of the secondary side winding for example terminate with pins which connect through the second PCB 62. The tails of the primary side winding form the first connection arrangement 67. The ends of the tails of the primary side winding are for example attached to the second printed circuit board by soldering them to solder pads or by using connectors.

Thus, the transformer may be a surface mount component or a through hole component which may be applied to either the first or the second printed circuit board. Note that the triple insulated wire may be used, if desired, for both windings and both connection arrangements.

FIG. 6C shows an example with a glass, ceramic or mica spacer 70 mounted to the first and second printed circuit boards, which defines and sets the clearance 64 between the first and second printed circuit boards, to meet the clearance requirements. Thus, the spacer provides the mechanical connection between the printed circuit boards. The spacer 70 is chosen to be particularly resistant to partial discharges. Suitable materials may then avoid creepage distance requirements being introduced between the first and second printed circuit boards.

Figure 7:
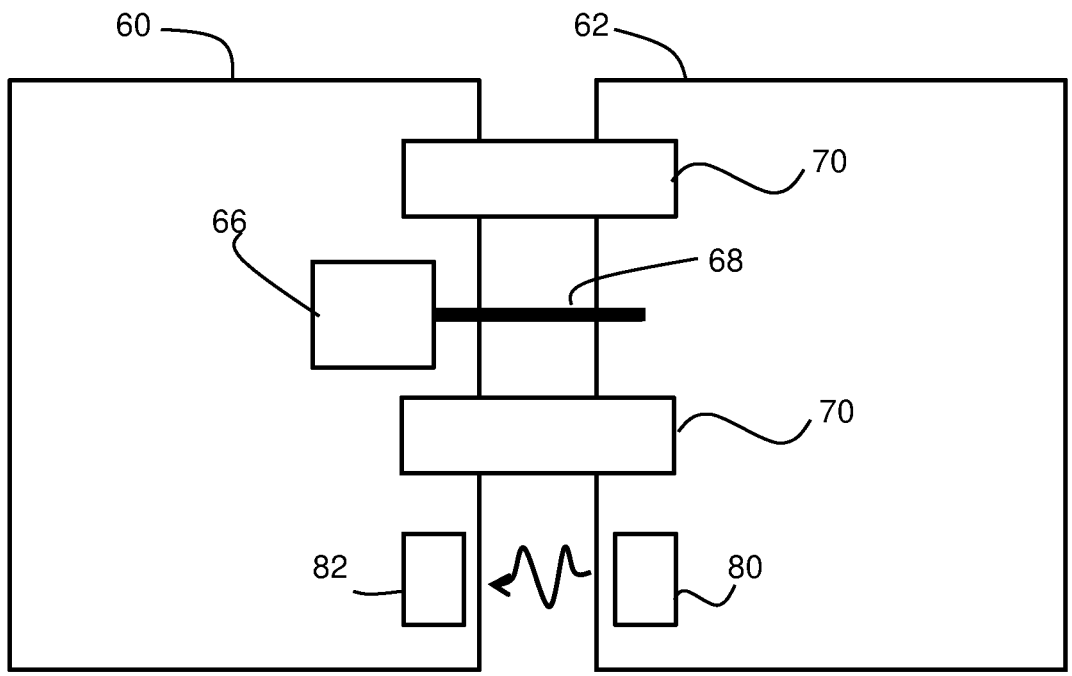
FIG. 7 shows an arrangement in plan view with ceramic spacers.

The spacers may be at different locations to the transformer (shown in FIG. 7). However, in FIG. 6C, the transformer 66 is mounted at, and in particular on, the spacer 70. The transformer 66 may thus be mounted separate to the first and second printed circuit boards.

The transformer is connected by a direct attachment of the tails to the two printed circuit boards, or there may wiring internal to the spacer 70.

FIG. 6D shows an example in which a spacer 70 forms a bobbin of the transformer, and the primary and secondary windings are wound around the bobbin. Pins may be used to terminating tails of both windings.

FIG. 7 shows an arrangement in plan view with the ceramic spacers 70 separate to the transformer 66, which in this example is mounted on the first printed circuit board 60. As an alternative, the first PCB 60 could be connected by spacers 70 to a housing and the second PCB 62 could be connected by spacers 70 to the same housing. Not all of these spacers then need to be ceramic.

The two printed circuit boards for example together define a switch mode power supply forming part of an LED driver. Switched mode power supplies are used widely in LED driver circuits.

Controllable LED drivers may be used to vary the voltage and/or current supply provided to the LED load. One known use of such controllable drivers is to controllably dim an LED output load. In such drivers, the isolating transformer 66 provides isolation between the input and output side of the switch mode power supply. There is typically control circuitry at the primary side of the isolating transformer to receive and convert an input supply in response to a feedback signal from the secondary side.

The first printed circuit board for example receives a mains input voltage, and the output from the second printed circuit board delivers a DC voltage with regulated current and/or voltage to an LED arrangement.

For the regulation function, an optical feedback system is provided for delivering an optical feedback signal from the second set of components to the first set of components. An optical transmitter 80 is mounted on the second printed circuit board 62 and an optical receiver 82 is mounted on the first printed circuit board 60. This is used by the LED driver for regulating the output voltage and/or current using feedback from the secondary side. The optical feedback system thus comprises an opto-coupler which bridges the isolation barrier, and is split between the primary and secondary printed circuit boards.

Figure 8:
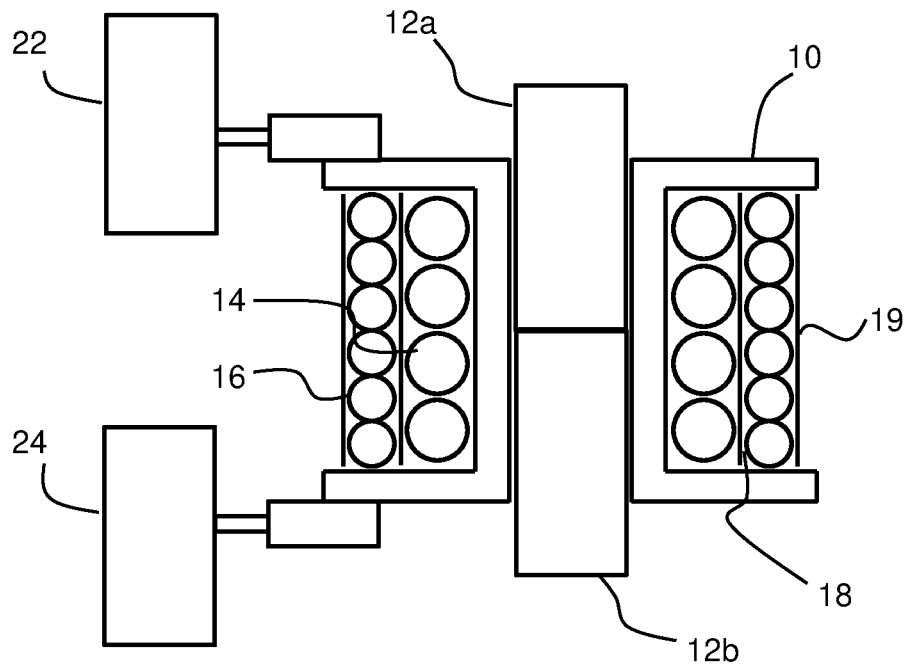
FIG. 8 shows how the transformer of FIG. 1 is modified by the invention.

FIG. 8 shows how the transformer of FIG. 1 is modified by the invention. In this example, the primary side winding 14 is formed of triple insulated wire, and hence is shown with larger diameter than the secondary side winding 16. This avoids the need for insulating tape (or insulating surrounds at the transformer tails).

The transformer core 12 is shown as a split core comprising an upper core half 12a and a lower core half 12b of a soft magnetic ferrite core, passing through the bobbin 10. They for example comprise two E core halves. There is a tape 18 between the windings and an outerwrap 19, which is mainly for fixing the winding mechanically.

Figure 9:
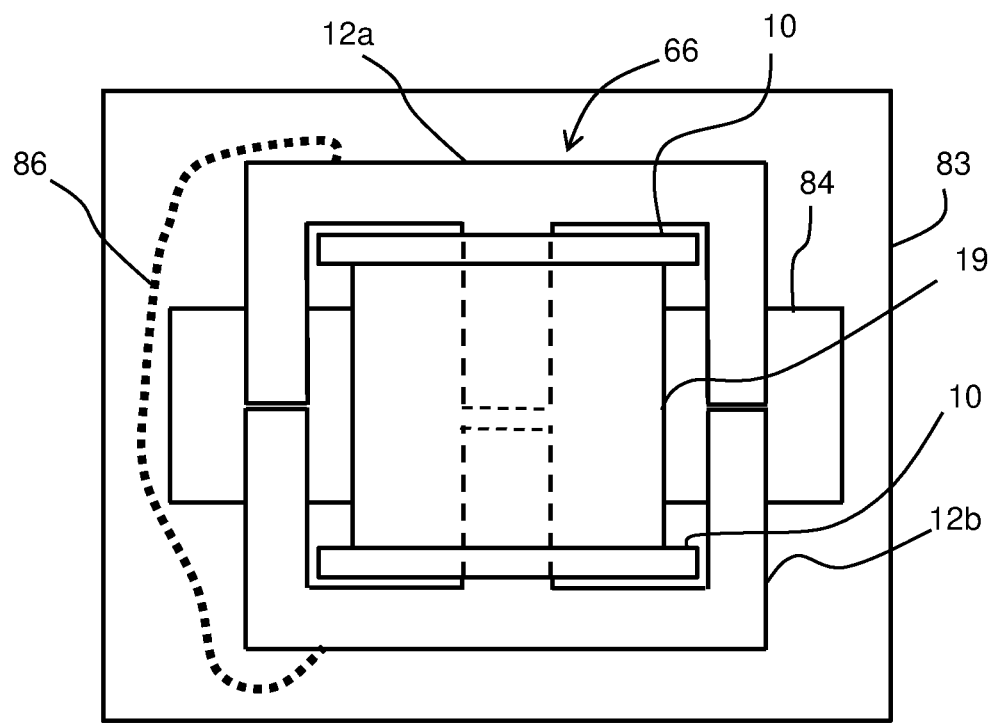
FIG. 9 shows that a ceramic frame may form the central core of the transformer.

FIG. 9 shows the transformer 66 of FIG. 8 mounted on a PCB 83. The bobbin 10, transformer core halves 12a, 12b and the outerwrap 19 are shown. The windings are not shown, as they are beneath the outerwrap 19.

The transformer 66 is shown mounted on a PCB 83 with a slot 84, so a creepage path 86 exists around the slot from the primary side to the secondary side. At high voltages and frequencies, this path may still be too short to meet the creepage requirements.

Figure 10:
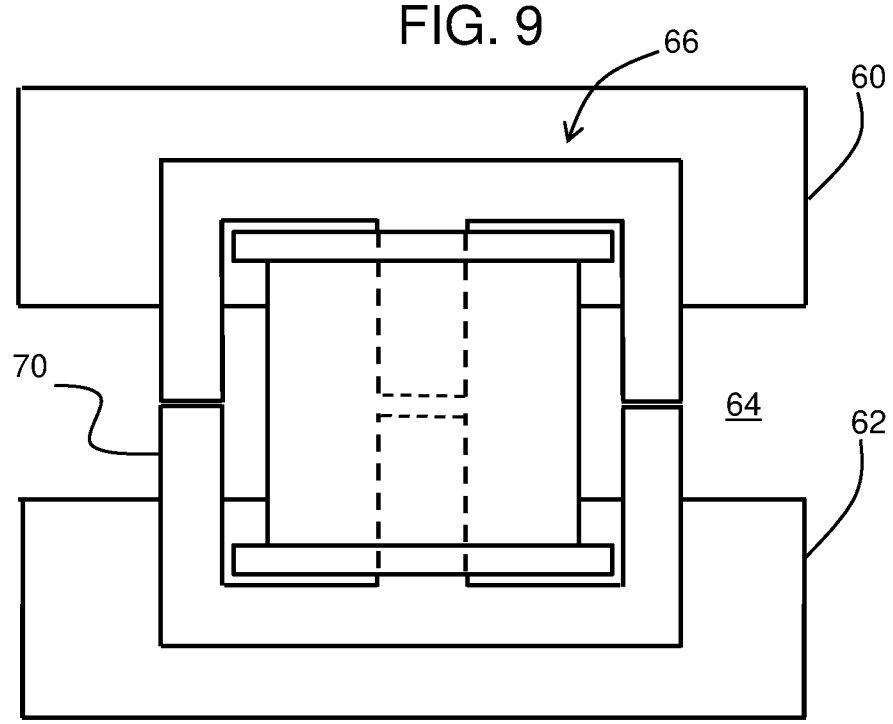
FIG. 10 shows how the transformer design of FIG. 9 may implement an arrangement in which the transformer itself spans the clearance between first and second printed circuit boards.

FIG. 10 shows how the transformer design of FIG. 9 may implement the arrangement of FIG. 6D, in which the transformer itself spans the clearance 64 between the first and second printed circuit boards 60, 62. The bobbin 10 is attached to the PCBs as shown in FIG. 8. The bobbin 10 acts as the ceramic spacer. The creepage path shown in FIG. 9 is no longer present. The connections between the two printed circuit boards includes either the triple insulated wire or the ceramic bobbin 10.

For completeness, FIG. 11 shows an exemplary simplified prior art topology of a known driver 90. A flyback converter topology is shown, which is known for use in both AC/DC and DC/DC conversion with galvanic isolation between the input and any outputs. The flyback converter is a buck-boost converter with the inductor split to form the isolating transformer, thus combining the advantage of scaling primary-to-output voltages while also achieving isolation. The controllable driver 90 comprises a primary converter 92, feedback control circuit 94 and the opto-isolator 80, 82.

The primary converter 92 receives and converts an input supply Vsup (e.g. mains) using a power generator 93 to generate a supply signal Vload for provision to the LED load 98. The primary converter 92 and the LED load 98 are electrically isolated from one another by a first winding 100 and a second winding 102, magnetically coupled together by a shared magnetic core 104. The level of the supply signal (voltage Vload and/or current) is adjustable by the power generator 93 in response to an adjustment signal, Vad.

The power generator 93 for example includes EMI filtering, a fuse, a rectifier, the high frequency switch of the switch mode power converter and associated switch mode control circuitry for regulating the output in response to the feedback from the feedback control circuit 94.

The feedback control circuit 94 generates an error signal from a sense signal Ifb or Vfb (shown only schematically in FIG. 11) and a reference signal, and from this error signal the adjustment signal Vad is derived using comparison circuitry. In the example shown, a dimming interface 106 receives an input voltage Vin and generates the reference voltage used by the feedback control circuit 94 to generate the error signal and then the adjustment signal Vad. In another example, the feedback control circuit 94 and dimming interface 106 are located at the primary side (between the opto-isolator 80, 82 and the power generator 93). A separate unit then receives Ifb or Vfb and drives the opto-isolator 80, 82 such that these are transmitted.

The adjustment signal Vad is provided to the primary converter 92 by the feedback control circuit 94 via the opto-isolator 80,82. Thus, the adjustment signal implements current or voltage feedback control.

The sense signal Ifb or Vfb in this example is directly connected to the feedback control circuit 94, and in particular comparison circuitry, from the second winding 102 (i.e. from the isolated supply signal supplied to the load).

The driver, therefore, delivers a controllable output supply signal (voltage and/or current) to the load, whilst ensuring isolation of the load from the primary converter. The control circuitry used to control the output supply is also isolated from the primary converter.

The feedback control implemented by the circuit 94 may be for regulating the output voltage or current. Some lighting loads require current regulation and others require voltage regulation. Thus, current sensing and feedback control or voltage sensing and feedback control are both possible.

The circuit of FIG. 11 may be adapted in accordance with the invention by providing the primary side components on the first printed circuit board and the secondary side components on the second printed circuit board and implementing the transformer and connections as explained above.

This is only one schematic example of a switch mode power supply architecture. Other topologies may of course be used. In general, there is a main inductor which controls the storage of energy from the input and the delivery of stored energy to the load. A main power switch controls the supply of energy from the input to the main inductor. The timing of operation of the main power switch, in particular the duty cycle, controls the energy transfer. A common low cost switched mode power converter is a single stage converter, such as a buck converter or a buck-boost converter.

The first set of components on the first printed circuit board for example includes GaN or SiC transistors or other wide band gap material transistors. These may be used as high power high frequency transistors. For example, particularly for GaN transistors, they may have a working voltage of over 500V and a frequency of operation of over 750 kHz, for example over 1 MHz, for example over 1.5 MHz. SiC transistors are for example operated at higher voltages but lower frequencies than GaN transistors.

The second set of components on the second printed circuit board for example include Si transistors. They may have a working voltage of below 500V.

As an example, a synchronous rectifier may be located between the secondary side winding 102 and the LED load 98, or simply a rectifier diode may be used, allowing current to flowing to the load 98 but not in the other direction.

The operating frequency is the same on both sides of the transformer.

The wide band gap materials are of particular interest on the high voltage primary side, by they may also be used on the low voltage secondary side, where they will still enable space savings.

The first and second sets of components for example together define a switch mode power supply such as shown in FIG. 11.

The opto-isolator 80, 82 bridges the clearance between the printed circuit boards. Other components may also bridge the isolation barrier. For example, glass-ceramic capacitors (e.g. as disclosed in WO 2015/173409 A1) can be used as Y-capacitors for RF noise reduction, and may also bridge the isolation barrier. The Y-capacitor is then split between primary and secondary printed circuit boards, it connects to the first winding 100 and the second winding 102 to reduce EMI. Y-capacitors are in general considered safe for low frequencies. For the high frequencies discussed above, glass ceramic capacitors should for example be used.

Triple insulated wires are for example formed with three-layer extruded coatings of high performance polymer resins or three-layer wrapped insulating tape coatings. FIG. 12 shows a copper wire core 110 (which may be a single strand or multiple strands), and three insulation layers 112, 114, 116. This gives excellent dielectric properties. Unlike enameled wires, three layers of insulation may be extruded over a copper core by an automated manufacturing process to ensure perfect central position of conductor.

The outer insulator is for example polyamide, and the two inner insulating layers are for example modified heat resistant polyester.

Various designs of triple insulated wire are commercially available, for example from Furukawa (Trade Mark).

The invention may be used when GaN or SiC power transistors are desired as mentioned above, but the invention may also be applied to other wide band gap (WBG) power transistors.

The examples above all show a transformer with a single primary side winding and a single secondary side winding. There are transformers with two or more output windings. If these two or more output windings bridge the clearance, then all of them must be made from the triple insulated wire. Electrical connections between these windings must be made after the clearance has been bridged.

Variations to the disclosed embodiments can be understood and effected by those skilled in the art in practicing the claimed invention, from a study of the drawings, the disclosure and the appended claims. In the claims, the word "comprising" does not exclude other elements or steps, and the indefinite article "a" or "an" does not exclude a plurality.

The mere fact that certain measures are recited in mutually different dependent claims does not indicate that a combination of these measures cannot be used to advantage.

If the term "adapted to" is used in the claims or description, it is noted the term "adapted to" is intended to be equivalent to the term "configured to".

Any reference signs in the claims should not be construed as limiting the scope.

The invention claimed is:

1. A circuit, comprising:
a first printed circuit board carrying a first set of components;
a second printed circuit board carrying a second set of components, with a clearance between the first and second printed circuit boards; and
a transformer having a primary side winding and a secondary side winding, wherein the primary side winding is electrically connected to the first set of components by a first connection arrangement and the secondary side winding is connected to the second set of components by a second connection arrangement,
wherein the primary side winding and the first connection arrangement and/or the secondary side winding and the second connection arrangement comprise an insulated wire, wherein the wire is a triple insulated wire,
wherein the circuit comprises a glass, ceramic or mica spacer mounted to the first and second printed circuit board, which defines the clearance between the first and second printed circuit boards; or
a first spacer mounted to the first printed circuit board and to an intermediate support part, a second spacer mounted to the second printed circuit board and to the intermediate support part, wherein the first spacer and/or the second spacer comprises glass, ceramic or mica, the clearance between the first and second printed circuit boards being defined by the first spacer, second spacer and the support part.

2. The circuit of claim 1, wherein the transformer is mounted on the first printed circuit board, and the secondary side winding and the second connection arrangement comprise a triple insulated wire, and the second connection arrangement extends across the clearance between the first and second printed circuit boards.

3. The circuit of claim 1, wherein the transformer is mounted on the second printed circuit board, and the primary side winding and the first connection arrangement comprise a triple insulated wire, and the first connection arrangement extends across the clearance between the first and second printed circuit boards.

4. The circuit of claim 1, further comprising a glass, ceramic or mica spacer mounted to the first and second printed circuit board, which defines the clearance between the first and second printed circuit boards, wherein the transformer is mounted at the spacer.

5. The circuit of claim 1, further comprising a glass, ceramic or mica spacer mounted to the first and second printed circuit board, which defines the clearance between the first and second printed circuit boards, wherein the transformer comprises a bobbin formed by the spacer, and the primary and secondary windings are wound around the bobbin.

6. The circuit of claim 1, wherein the first set of components include SiC or GaN transistors.

7. The circuit of claim 6, wherein the SiC or GaN transistors have a working voltage of over 400V and a frequency of operation of over 750 kHz.

8. The circuit of claim 1, wherein the second set of components include Si transistors.

9. The circuit of claim 8, wherein the Si transistors have a working voltage of below 400V.

10. A LED driver comprising:
an input for receiving a mains input voltage;
a switch mode power supply comprising the circuit of claim 9; and
an output for delivering a DC voltage with regulated current and/or voltage to an LED arrangement.

11. The LED driver of claim 10, comprising an optical feedback system for providing optical feedback from the second set of components to the first set of components, comprising an optical transmitter mounted on the second printed circuit board and an optical receiver mounted on the first printed circuit board.

12. A lighting circuit comprising:
the LED driver of claim 10; and
the LED arrangement, powered by the LED driver.

13. The circuit of claim 1, wherein the first and second sets of components together define a switch mode power supply.

* * * * *